INVENTOR.
JOHN A. TOURTELLOT
BY
Eugene M. Whitacre
Attorney

INVENTOR.
JOHN A. TOURTELLOT
BY
Eugene M. Whitacre
Attorney

INVENTOR.
JOHN A. TOURTELLOT
BY
Eugene M. Whitacre
Attorney

United States Patent Office 3,444,333
Patented May 13, 1969

3,444,333
PHONOGRAPH WITH CIRCUIT BOARD MOUNTED ON THE MOTORBOARD BENEATH THE TURNTABLE

John Allen Tourtellot, Indianapolis, Ind., assignor to Radio Corporation of America, a corporation of Delaware Filed May 8, 1964, Ser. No. 366,020
Int. Cl. C11b *3/00*
U.S. Cl. 179—100.4 6 Claims

ABSTRACT OF THE DISCLOSURE

Phonograph apparatus construction in which the motorboard serves as a mounting support for a printed circuit board and a heat sink for a power transistor.

This invention relates to phonographs and like record playing equipment, and more particularly to phonographs employing semiconductor amplifier circuits.

A phonograph in accordance with the invention comprises as an integrated unit, a record playing mechanism and associated amplifier for electrical signal transduced from a record being played. The amplifier stage includes a plurality of components such as resistors, capacitors, transformers and amplifying devices mounted on a printed circuit board and a power output transistor. The amplifier printed circuit board is mounted on a metallic motorboard for the record player by means of supports which are electrically insulated from the motorboard but which provide electrical connections to the circuit elements on the printed circuit board and which thereby provide circuit connection terminals. The power transistor is mounted on the motorboard. In addition to providing a support for the power transistor, the motorboard serves as a heat sink to dissipate heat generated by the power transistor. The resultant integrated unit occupies no more space than is required by the record playing mechanism alone.

The novel features which are considered to be characteristic of this invention are set forth with particularity in the appended claims. The invention itself, however, both as to its organization and method of operation as well as additional objects and advantages thereof, will best be understood from the following description when read in connection with the accompanying drawings in which:

Figure 1:
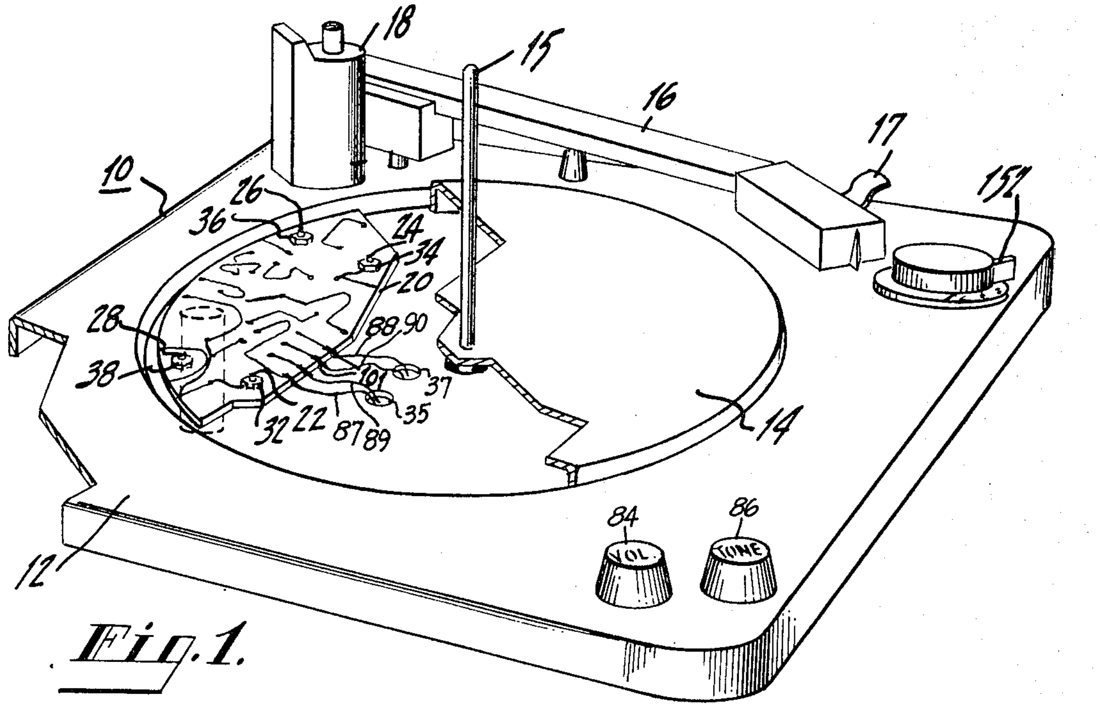
FIGURE 1 is a top view, in perspective, partially broken away of an integrated phonograph system embodying the invention, showing the assembly of the amplifier printed circuit board on the motorboard, underneath the turntable.
Figure 2:
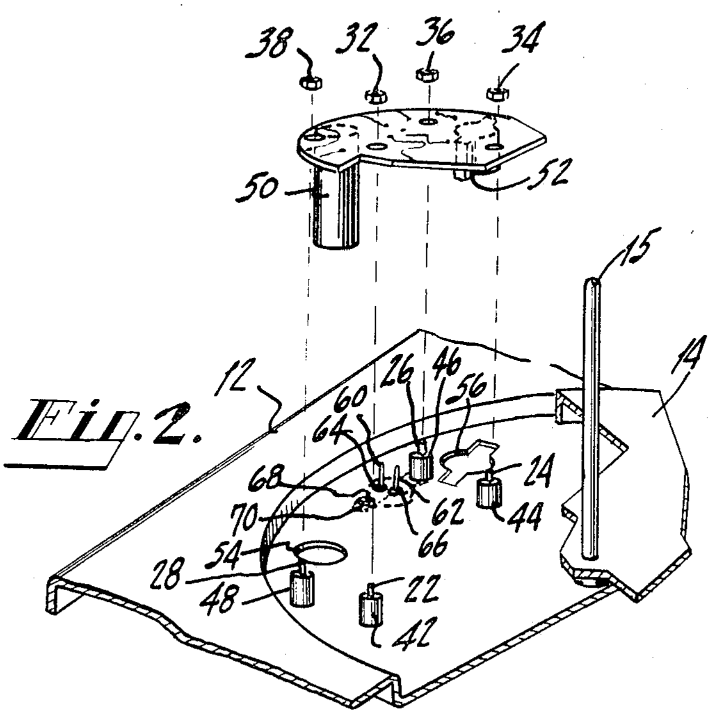
FIGURE 2 is an exploded view showing the mounting of the printed circuit board on the motorboard.
Figure 3:
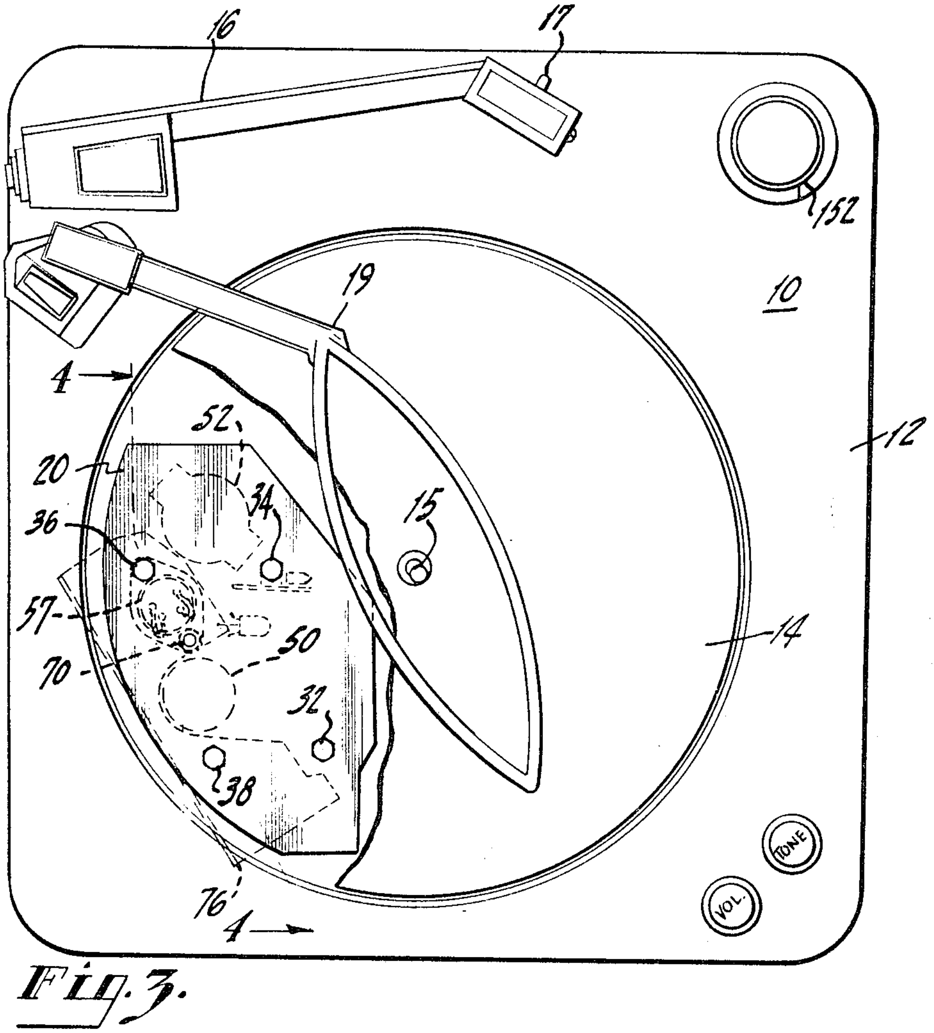
FIGURE 3 is a plan view of the phonograph of FIGURE 1.

Reference is now made to the drawings, and particularly to FIGURES 1, 2 and 3, wherein like reference numerals are applied to like elements and parts throughout the various figures. A phonograph 10, embodying the invention, is provided with a motorboard or turntable base 12 on which is mounted the usual motor driven turntable 14. A record to be played is placed on the turntable on the central turntable spindle 15, of known construction, and which may be of the manual-play type or the automatic-release type. A tone arm 16 is mounted on a tone arm shaft to enable independent pivoting in a vertical plane to permit pickup servicing.

A phonograph pickup, not shown, is supported near the free end of the tone arm 16. The phonograph pickup may include a rotatable stylus changing control knob 17 extending from a side of the free end of the tone arm.

A record stabilizing arm 19, shown in FIGURE 3, may be mounted in a housing 18 on the motorboard 12.

An amplifier printed circuit board 20, including the preamplifier, or first two stages of a three stage amplifier circuit, is mounted on the motorboard by means of a set of screws or mounting studs including screws 22, 24, 26 and 28, which are inserted through appropriate openings on the motorboard and which are fastened against the printed circuit board in electrical contact with the amplifier circuit by means of the corresponding nuts 32, 34, 36 and 38.

A set of spacers 42, 44, 46 and 48 (FIGURE 2), which are made of a suitable electrical insulating material are placed between the motorboard 12 and the printed circuit board 20, as shown in FIGURE 2, for mounting the printed circuit board 20 on the motorboard. The screws 22, 24, 26 and 28 are mounted on the motorboard 12 through insulating washers, not shown, placed between the motorboard 12 and the heads of the screws to provide electrical insulation. Also, the openings on the motorboard are sufficient diameter to clear the screws to avoid contact of the screws and the motorboard. To insure electrical isolation between the screws and the motorboard, insulating bushings extending into the openings may also be provided if desired.

As shown in FIGURES 1, 2 and 3, the printed circuit board 20 is mounted on the motorboard 12 underneath the rotatable turntable 14, thereby utilizing space not otherwise used.

Components on the printed circuit board 20, which are longer than the spacers 42, 44, 46 and 48 are inserted through openings made on the motorboard 12, as shown in FIGURE 2. For example, an electrolytic capacitor 50 and a choke 52 are respectively inserted through the openings 54 and 56.

Figures 4, 5:
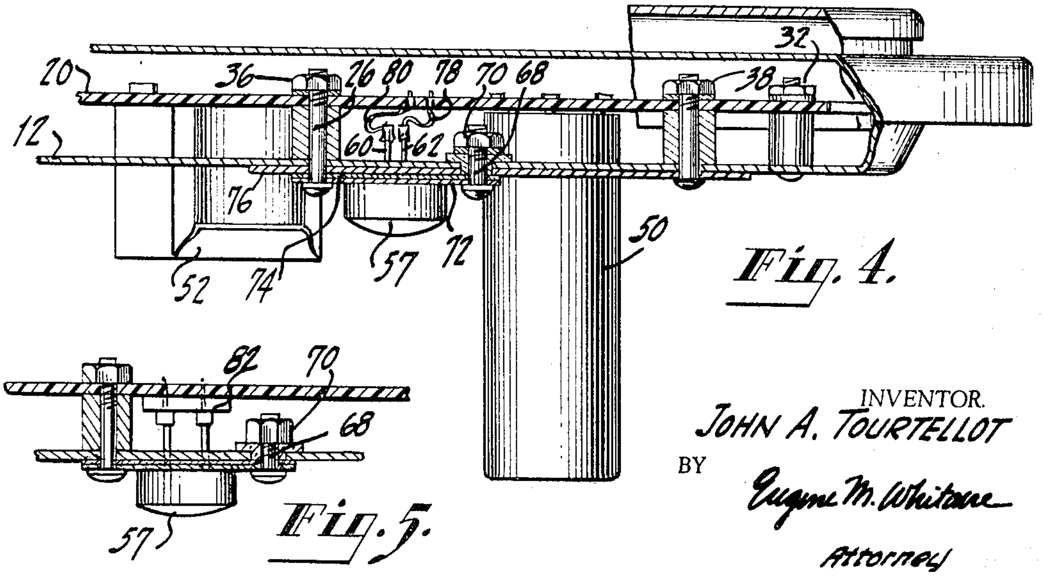
FIGURE 4 is a cross sectional view, taken along section line 4—4 in FIGURE 3.
FIGURE 5 is a less inclusive cross sectional view, similar to FIGURE 4, showing further details of the mounting of the power transistor on the motorboard in a phonograph embodying the invention.

Additional reference is now made to FIGURES 4 and 5 of the drawings, which respectively show a cross sectional view taken along section line 4—4 in FIGURE 3, and a cross sectional view similar to the one shown in FIGURE 4, illustrating an alternative coupling between the amplifier output stage transistor 57 and the printed circuit board 20.

As shown in FIGURE 4, a power transistor 57, which constitutes the amplifier's output stage is not mounted on the printed circuit board 20, but is separately mounted on the motorboard 12. The conductive casing 72 of the transistor 57 and which is in electrical and thermal contact with its collector electrode, is mounted by means of screws 26 and 68 respectively inserted through openings provided in the casing 72. An insulating washer 74, having a shape and area similar to the shape and area of the casing 72 is placed between the transistor casing 72 and the motorboard 12 to provide electrical insulation between the transistor collector electrode and the motorboard 12. The washer 74 is made of a material, such as mica for example, which is thermally conductive, so that the motorboard 12 acts as the heat sink for the transistor 57. As shown in FIGURES 3 and 4, an L shaped metallic bracket 76 may be provided to increase heat dissipation and hence increase the power operational capabilities of the transistor. The bracket 76 is mechanically mounted between the motorboard 12 and the mica washer 74. If desired, the mica washer 74 may be mounted between the motorboard 12 and the bracket 76 to further increase the power dissipation capabilities of the transistor 57.

As shown in FIGURE 2, pins 60 and 62 which constitute the base and emitter electrodes of transistor 57 are inserted through the openings 64 and 66 in the motorboard 12. The base and emitter electrodes of transistor 57 may be connected to the printed circuit board 20 by means of a pair of leads 78 and 80, soldered to the printed circuit board 20 at one end and having appropriate terminals to provide electrical connections to the pins 60 and 62, as shown in FIGURE 4 for example, or in the alternative by means of a transistor socket 82 soldered to the printed circuit board for receiving the transistor pins 60 and 62, as shown in FIGURE 5.

The mounting stud 26 directly connects the collector electrode of the transistor 57 to the printed circuit board 20. The amplifier output signals are taken from the printed circuit board 20 by a pair of conductors 88 and 90 for applications to a loudspeaker, not shown.

In addition, an input circuit, including the volume and tone controls, is mounted on the motorboard 12 separately from the printed circuit board 20. As more fully described hereinafter, the knobs for these controls are accessible from the top of the motorboard 12, and the electrically controlled elements thereof are on the bottom. The signals generated by the pickup device are coupled to the input circuit by means of a pair of wires having a section located inside of the tone arm 16 and which have the remaining section inserted through an appropriate opening in the motorboard 12 for connection to the input circuit. The input circuit is coupled to the printed circuit board 20 by means of a pair of wires 87 and 89, shown in FIGURE 1, and which are inserted through the opening 35 in the motorboard 12.

Figure 6:
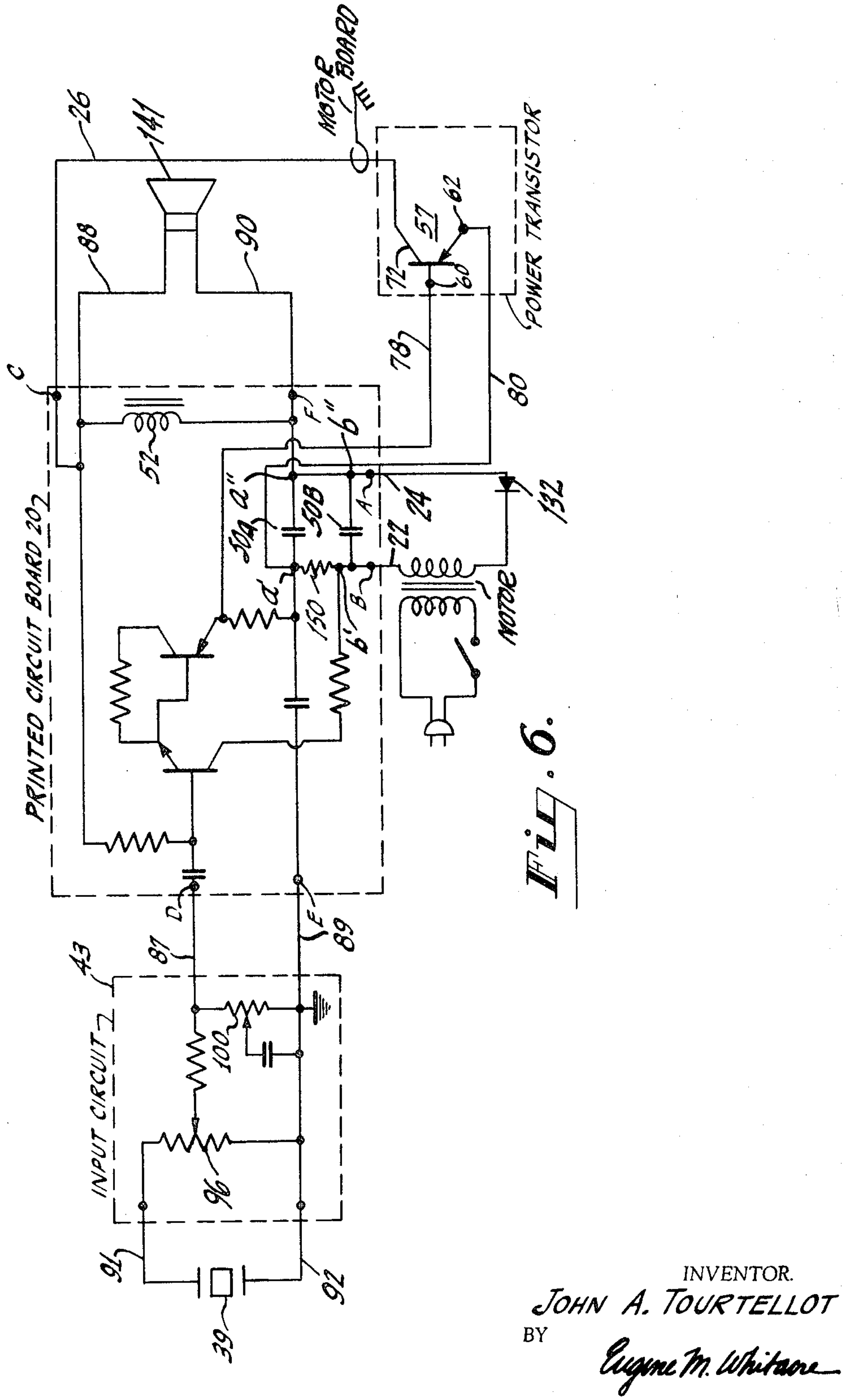
FIGURE 6 is a schematic circuit diagram of an amplifier circuit employed in a phonograph embodying the invention.

Reference is now made to FIGURE 6 as well as the other figures. FIGURE 6 is a schematic circuit diagram of an amplifier circuit employed in a phonograph embodying the invention, and which is also helpful in illustrating in conjunction with FIGURES 1, 2, 3, 4 and 5 the operation and construction of the phonograph.

A crystal pickup, mounted in the tone arm 16, shown in FIGURE 1, for example, and which is of known construction, generates electrical signals in a well-known manner. The input signals are applied to the input circuit 43 by means of a pair of wires 91 and 92 inserted through an opening provided in the motorboard 12 and partially located in the tone arm 16. A variable resistor 96 mounted on the bottom side of the motorboard 12, is employed to control the volume of the sound of the phonograph. A knob 84 labelled "Vol." is attached to the shaft of the variable resistor 96 inserted through an appropriate opening in the motorboard 12 to control the volume of the sound when the record player is in operation. By mounting the input circuit on the motorboard, not only is space used that would otherwise be wasted, but the length of the leads between the pickup device and the volume control may be considerably reduced.

A variable resistor 100 is connected to the center arm of the resistor 96 to provide tone control, in a well-known manner. The resistor 100 is also mounted on the bottom side of the motorboard 12 in a manner similar to that of the mounting of the variable resistor 96. A knob 86 labelled "Tone," is attached to the shaft of the resistor 100, inserted through an appropriate opening in the motorboard 12, to permit control of the frequency response of the amplifier while the phonograph is in operation.

The pair of wide leads 87 and 89, shown in FIGURE 1, couple the input signals to the terminals D and E in the printed circuit board 20. The printed circuit board 20 includes a plurality of serrations or slots such as 101, for the insertion of the metallic connectors connected at the ends of leads 87 and 89 to provide electrical contact with the terminals D and E.

The phonograph amplifier circuit comprises three stages of amplification. The first two stages, the preamplifier portion, includes two transistors mounted on the printed circuit board 20. The output stage, or power amplifier stage, includes the power transistor 57, shown in FIGURES 2, 4 and 5, and which is mounted on the motorboard 12. The preamplifier portion, i.e., the input stages of the amplifier circuit, is coupled to the power transistor 57 by the wire leads 78 and 80, as illustrated in FIGURE 4, or by a suitable transistor socket 82, as shown in FIGURE 5, and in the manner previously described.

The casing 72 of the power transistor 57, which is thermally and electrically connected to the collector electrode of the transistor 57, is connected to the printed circuit by the mounting stud 26, as shown in FIGURES 4 and 5, and provides an output signal terminal C.

The terminal F, on the printed circuit board 20, is electrically connected to the power transistor emitter electrode pin 62. Output signals are derived between the output terminals C and F, across the choke 52, and coupled to a loudspeaker 141 by the pair of wires 88 and 90 each having a metallic connector inserted in a serration or slot 101 corresponding to terminals C and F, respectively, as shown in FIGURE 1.

Power is supplied to the transistor circuit by means of a half wave rectifier circuit including a rectifier 132 mounted on the bottom side of the motorboard on a suitable small piece of terminal board (not shown) by means of the screw 24, previously described, and which is in electrical contact with the printed circuit board 20 at terminal A. The anode electrode of the rectifier 132 is in electrical contact with the terminal A on the printed circuit board 20, and the cathode electrode is connected to one end of the secondary winding of an electrical motor employed to rotate the turntable 14. The other end of the secondary winding of the electrical motor is connected to a terminal, not shown, mounted on the bottom side of the motorboard 12 through the screw or mounting stud 22, previously described. The screw 22 is electrically connected to terminal B of the printed circuit board 20. By directly applying the input power to the terminals A and B not only the mounting means of the printed circuit board are used, but additional wiring as required heretofore is unnecessary.

A capacitor 50, which may be an electrolytic capacitor shown in FIGURES 2, 3 and 4, and mounted on the printed circuit board 20, is electrically connected between the terminals A and B on the printed circuit board. If desired, the capacitor 50 may be a dual electrolytic type capacitor of known construction, including capacitors 50A and 50B, having two pairs of terminals $a'$, $a''$, and $b'$, $b''$, each adapted for independent connections. In the alternative, two separate capacitors, each having the desired value of capacitance to provide minimum ripple, may be employed.

A resistor 150 is connected between the terminals $a'$ and $b'$ to provide in conjunction with the capacitors 50A and 50B a filter circuit for the half wave rectifier power supply. In addition, to provide temperature stabilization of the transistor 57 by well-known direct current degeneration, the resistor 150 is also connected to the emitter electrode pin 62. The terminals $a''$ and $b''$ which are internally connected to each other in the case of a dual type capacitor, are electrically connected to the terminal A of the printed circuit board 20.

As described and as shown in FIGURES 1–6, by mounting the amplifier circuit on the top side of the motorboard 12, underneath the turntable 14 and clear from the mechanism associated with the turntable, space which heretofore has been wasted is employed. This results in a compact phonograph with a consequent reduction in cost, and with an increase in the freedom of styling. For example, instead of the extra chassis heretofore required for the amplifier, a single chassis, the motorboard, is employed for both the record player and amplifier. This provides a more compact, light weight and inexpensive phonograph which in the case of portable phonographs, for example, is extremely important.

In addition, to provide transistor amplifiers capable of operation with a desired output power characteristic, a suitable heat sink should be provided for the output transistor with the resulting added cost and weight, and with the additional waste in useable space. By mounting the transistor in thermal conductive relation with the motorboard, the motorboard itself may be employed as a heat sink with additional savings in cost, space, and weight. If desired, the transistor may be mounted electrically insulated from the motorboard but in thermal conductive relation to increase the freedom of circuit design and still obtain the advantages above-mentioned.

An off-on switch, not shown, also mounted on the top side of the motorboard, is connected at one end between the primary winding of the motor and a plug. The off-on switch is mechanically activated by a lever arrangement which includes a control lever in mechanical contact with the switch. The phonograph is turned on or off as desired by energizing the switch, which in turn energizes the motor and provides rotation of the turntable. Closing the switch also provides an operating potential for the amplifier circuit. A function control knob 152 shown in FIGURE 1, is in mechanical relation with the control lever to permit operation of the off-on switch when the phonograph is assembled and ready for operation.

Although a monophonic phonograph embodying the invention has been described and illustrated, the invention is applicable to other type phonographs, such as stereophonic phonographs for example.

In the case of a stereophonic phonograph, the amplifier circuit would include two amplifier channels, each having a preamplifier portion, similar to the preamplifier shown in FIGURE 6 as the first and second stages of the amplifier, mounted on a single printed circuit board, similar to the printed circuit board 20 shown in the drawings. The mounting of the printed circuit board may be the same as described above, with the exception that the mounting stud 28 may be utilized for mounting another power transistor, similar to the transistor 57. In this case, the stud 28 would be in electrical connection with the amplifier circuit and it would provide an output terminal for one of the two channels. The mounting of the additional transistor may be similar to the mounting of the transistor 57, as described in connection with FIGURES 4 and 5.

It is not necessary to mount the transistor on the motorboard through an electrical insulator as described in connection with FIGURES 4 and 5. In the case of a stereophonic phonograph, it may be desirable to employ two channels like the circuit configuration shown in FIGURE 6, and in that case at least one of the power transistors should be electrically insulated from the motorboard to avoid connecting both transistors in parallel.

The power transistors, however, may be directly mounted on the motorboard, if for example the motorboard is employed to provide a point of fixed reference potential, such as ground, and the power transistors are connected in the common collector configuration, for example.

In addition, other arrangements of the circuit and utilization of the mounting studs may be employed. For example the mounting studs utilized to apply the power input to the transistor may be utilized to apply the input signal from the input circuit 43, if desired, while the power input would be applied through a pair of lead wires, for example.

What is claimed is:

1. A phonograph comprising in combination:

a record player including a heat conductive motorboard having top and bottom sides and a turntable mounted on said motorboard, a circuit board including a plurality of circuit elements interconnected in a predetermined circuit configuration, a power transistor, means for mounting said circuit board on the top side of said motorboard underneath said turntable, and means for mounting said transistor in thermally coupled relation to said motorboard, and means interconnecting said power transistor and said circuit board.

2. A phonograph as described in claim 1 wherein said plurality of circuit elements extend down from said circuit board and are inserted through openings in said motorboard.

3. A phonograph as described in claim 1 wherein said means for interconnecting said transistor and said circuit board include a transistor socket for the transistor electrodes mounted on said circuit board, and wherein said means for mounting said transistor on said motorboard include a mounting stud in electrical contact with said circuit board.

4. In combination with a record player including a heat conductive motorboard having top and bottom sides, and a turntable:

a printed circuit board including circuit elements interconnected in a predetermined circuit configuration, a power transistor having base, emitter and collector electrodes encapsulated in a metallic casing, said collector electrode being electrically and thermally conductive through said metallic casing, said emitter and base electrodes each having a terminal to provide external connections for said transistor, means including a plurality of studs for mounting said transistor on the bottom side of said motorboard, said mounting means providing electrical insulation between said metallic casing and said motorboard, and thermal conduction from said metallic casing to said motorboard whereby said motorboard serves as a heat sink for said transistor, means for mounting said printed circuit board on said motorboard, including one of said plurality of studs so that said collector electrode of said transistor is in electrical contact with said printed circuit board, and means mounted on said printed circuit board including a transistor socket for electrically connecting said base and emitter electrodes and said printed circuit board.

5. A phonograph comprising in combination:

a record player including a heat conductive motorboard, and a turntable mounted on said motorboard, a circuit board including elements interconnected in a predetermined circuit configuration and having a plurality of serrated metallic portions to provide a plurality of circuit terminals, means for mounting said printed circuit board on said motorboard underneath said turntable, said mounting means including a plurality of studs in electrical contact with said circuit board, a power transistor, means including one of said plurality of studs for mounting said power transistor on said motorboard, said one of said plurality of studs providing an output signal terminal, said last mounting means including a washer to provide thermal conduction and electrical insulation between said motorboard and said transistor, whereby said motorboard serves as the heat sink for said transistor, means interconnecting said power transistor and said circuit board, means coupled to a pair of said plurality of circuit terminals for applying input signals to said printed circuit board, means coupled to a pair of said plurality of studs for applying input power to said printed circuit board, and means coupled to a different pair of said plurality of circuit terminals for deriving output signals.

6. A phonograph as described in claim 5 wherein the transistor mounting means includes a metallic bracket mounted between the motorboard and the transistor to provide additional heat sink capacity.

References Cited

UNITED STATES PATENTS

| | | | |
|---|---|---|---|
| 2,774,014 | 12/1956 | Henry | 317—101 |
| 2,984,774 | 5/1961 | Race | 317—234 |
| 3,301,952 | 1/1967 | Reznik | 179—100.11 X |

OTHER REFERENCES

TM11–2561, Reproducer, sound, portable, Washington, D.C., War Department, 1944, pp. 3, 7, 14, 20, 21, 22, 179/100.4.

BERNARD KONICK, *Primary Examiner.*

R. F. CARDILLO, Jr., *Assistant Examiner.*